(12) United States Patent
Mikulec et al.

(10) Patent No.: US 8,614,396 B2
(45) Date of Patent: Dec. 24, 2013

(54) METHOD AND MATERIAL FOR PURIFYING IRON DISILICIDE FOR PHOTOVOLTAIC APPLICATION

(75) Inventors: Frederic Victor Mikulec, Redwood City, CA (US); Bing Shen Gao, Los Altos, CA (US); Howard W. H. Lee, Saratoga, CA (US)

(73) Assignee: Stion Corporation, San Jose, CA (US)

( * ) Notice: Subject to any disclaimer, the term of this patent is extended or adjusted under 35 U.S.C. 154(b) by 774 days.

(21) Appl. No.: 12/209,802

(22) Filed: Sep. 12, 2008

(65) Prior Publication Data

US 2009/0087370 A1   Apr. 2, 2009

Related U.S. Application Data

(60) Provisional application No. 60/976,239, filed on Sep. 28, 2007.

(51) Int. Cl.
*H01L 31/00* (2006.01)
*C01B 21/068* (2006.01)

(52) U.S. Cl.
USPC .............. 136/261; 136/200; 419/23; 423/344

(58) Field of Classification Search
USPC ...................... 136/261, 200; 419/23; 423/344
See application file for complete search history.

(56) References Cited

U.S. PATENT DOCUMENTS

| | | |
|---|---|---|
| 4,335,266 A | 6/1982 | Mickelsen et al. |
| 4,441,113 A | 4/1984 | Madan |

(Continued)

FOREIGN PATENT DOCUMENTS

| | | |
|---|---|---|
| AU | 7865198 | 2/1999 |
| AU | 2001/40599 A1 | 8/2001 |

(Continued)

OTHER PUBLICATIONS

Belyaev et al. "The mechanochemical synthesis of thermoelectric material iron disilicide bases", 20th International Conference on Thermoelectrics (2001) 218-220.*

(Continued)

*Primary Examiner* — Rebecca Lee
(74) *Attorney, Agent, or Firm* — Kilpatrick Townsend & Stockton LLP

(57) ABSTRACT

A method for processing iron disilicide for manufacture photovoltaic devices. The method includes providing a first sample of iron disilicide comprising at least an alpha phase entity, a beta phase entity, and an epsilon phase entity. The method includes maintaining the first sample of iron disilicide in an inert environment and subjects the first sample of iron disilicide to a thermal process to form a second sample of iron disilicide. The second sample of iron disilicide comprises substantially beta phase iron disilicide and is characterized by a first particle size. The method includes introducing an organic solvent to the second sample of iron disilicide, forming a first mixture of material comprising the second sample of iron disilicide and the organic solvent. The method processed the first mixture of material including the second sample of iron disilicide using a grinding process. The method converted the second sample of iron disilicide having the first particle size to a third sample of iron disilicide having a second particle size. The organic solvent is removed and output a third sample of iron disilicide characterized by the second particle size and greater than about 90% of the beta phase entity.

15 Claims, 3 Drawing Sheets

(56) References Cited

U.S. PATENT DOCUMENTS

| | | | |
|---|---|---|---|
| 4,461,922 A | 7/1984 | Gay et al. | |
| 4,465,575 A | 8/1984 | Love et al. | |
| 4,471,155 A | 9/1984 | Mohr et al. | |
| 4,499,658 A | 2/1985 | Lewis | |
| 4,507,181 A | 3/1985 | Nath et al. | |
| 4,517,403 A | 5/1985 | Morel et al. | |
| 4,532,372 A | 7/1985 | Nath et al. | |
| 4,542,255 A | 9/1985 | Tanner et al. | |
| 4,581,108 A | 4/1986 | Kapur et al. | |
| 4,589,194 A | 5/1986 | Roy | |
| 4,589,918 A | 5/1986 | Nishida et al. | |
| 4,598,306 A | 7/1986 | Nath et al. | |
| 4,599,154 A | 7/1986 | Bender et al. | |
| 4,611,091 A | 9/1986 | Choudary et al. | |
| 4,623,601 A | 11/1986 | Lewis et al. | |
| 4,625,070 A | 11/1986 | Berman et al. | |
| 4,638,111 A | 1/1987 | Gay | |
| 4,661,370 A | 4/1987 | Tarrant | |
| 4,663,495 A | 5/1987 | Berman et al. | |
| 4,724,011 A | 2/1988 | Turner et al. | |
| 4,751,149 A | 6/1988 | Vijayakumar et al. | |
| 4,775,425 A | 10/1988 | Guha et al. | |
| 4,798,660 A | 1/1989 | Ermer et al. | |
| 4,816,082 A | 3/1989 | Guha et al. | |
| 4,914,042 A | 4/1990 | Mahan | |
| 4,915,745 A | 4/1990 | Pollock et al. | |
| 4,950,615 A | 8/1990 | Basol et al. | |
| 4,996,108 A | 2/1991 | Divigalpitiya et al. | |
| 5,008,062 A | 4/1991 | Anderson et al. | |
| 5,028,274 A | 7/1991 | Basol et al. | |
| 5,029,760 A | 7/1991 | Gamblin | |
| 5,039,353 A | 8/1991 | Schmitt | |
| 5,045,409 A | 9/1991 | Eberspacher et al. | |
| 5,069,868 A * | 12/1991 | Tokiai et al. | 419/23 |
| 5,078,803 A | 1/1992 | Pier et al. | |
| 5,083,712 A * | 1/1992 | Askew et al. | 241/16 |
| 5,125,984 A | 6/1992 | Kruehler et al. | |
| 5,133,809 A | 7/1992 | Sichanugrist et al. | |
| 5,137,835 A | 8/1992 | Karg | |
| 5,180,686 A | 1/1993 | Banerjee et al. | |
| 5,211,824 A | 5/1993 | Knapp | |
| 5,231,047 A | 7/1993 | Ovshinsky et al. | |
| 5,248,345 A | 9/1993 | Sichanugrist et al. | |
| 5,261,968 A | 11/1993 | Jordan | |
| 5,298,086 A | 3/1994 | Guha et al. | |
| 5,336,623 A | 8/1994 | Sichanugrist et al. | |
| 5,346,853 A | 9/1994 | Guha et al. | |
| 5,474,939 A | 12/1995 | Pollock et al. | |
| 5,484,490 A * | 1/1996 | Tokita et al. | 136/236.1 |
| 5,501,744 A | 3/1996 | Albright et al. | |
| 5,512,107 A | 4/1996 | Van den Berg | |
| 5,536,333 A | 7/1996 | Foote et al. | |
| 5,547,598 A | 8/1996 | Amano et al. | |
| 5,578,503 A | 11/1996 | Karg et al. | |
| 5,665,175 A | 9/1997 | Safir | |
| 5,676,766 A | 10/1997 | Probst et al. | |
| 5,977,476 A | 11/1999 | Guha et al. | |
| 5,981,868 A | 11/1999 | Kushiya et al. | |
| 5,985,691 A | 11/1999 | Basol et al. | |
| 6,040,521 A | 3/2000 | Kushiya et al. | |
| 6,048,442 A | 4/2000 | Kushiya et al. | |
| 6,092,669 A | 7/2000 | Kushiya et al. | |
| 6,127,202 A | 10/2000 | Kapur et al. | |
| 6,166,319 A | 12/2000 | Matsuyama | |
| 6,288,415 B1 | 9/2001 | Leong et al. | |
| 6,310,281 B1 | 10/2001 | Wendt et al. | |
| 6,328,871 B1 | 12/2001 | Ding et al. | |
| 6,372,538 B1 | 4/2002 | Wendt et al. | |
| 6,690,041 B2 | 2/2004 | Armstrong et al. | |
| 6,852,920 B2 | 2/2005 | Sager et al. | |
| 6,878,871 B2 | 4/2005 | Scher et al. | |
| 7,180,101 B2 | 2/2007 | Ouchi | |
| 7,194,197 B1 | 3/2007 | Wendt et al. | |
| 7,319,190 B2 | 1/2008 | Tuttle | |
| 7,855,089 B2 | 12/2010 | Farris, III et al. | |
| 7,863,074 B2 | 1/2011 | Wieting | |
| 2002/0063065 A1 | 5/2002 | Sonoda et al. | |
| 2003/0075717 A1 | 4/2003 | Kondo et al. | |
| 2004/0095658 A1 | 5/2004 | Buretea et al. | |
| 2004/0110393 A1 | 6/2004 | Munzer et al. | |
| 2004/0203220 A1 | 10/2004 | Morooka et al. | |
| 2004/0244826 A1 | 12/2004 | Takagi | |
| 2004/0245912 A1 | 12/2004 | Thurk et al. | |
| 2004/0252488 A1 | 12/2004 | Thurk | |
| 2005/0087264 A1* | 4/2005 | Tanoue et al. | 148/33.3 |
| 2005/0287717 A1 | 12/2005 | Heald et al. | |
| 2006/0002838 A1 | 1/2006 | Oda et al. | |
| 2006/0003585 A1 | 1/2006 | Morooka et al. | |
| 2006/0034065 A1 | 2/2006 | Thurk | |
| 2006/0051505 A1 | 3/2006 | Kortshagen et al. | |
| 2006/0053969 A1 | 3/2006 | Harada et al. | |
| 2006/0096536 A1 | 5/2006 | Tuttle | |
| 2006/0096537 A1 | 5/2006 | Tuttle | |
| 2006/0096635 A1 | 5/2006 | Tuttle | |
| 2006/0102230 A1 | 5/2006 | Tuttle | |
| 2006/0219288 A1 | 10/2006 | Tuttle | |
| 2006/0219547 A1 | 10/2006 | Tuttle | |
| 2006/0220059 A1 | 10/2006 | Satoh et al. | |
| 2007/0089782 A1 | 4/2007 | Scheuten et al. | |
| 2007/0116892 A1 | 5/2007 | Zwaap | |
| 2007/0116893 A1 | 5/2007 | Zwaap | |
| 2007/0151596 A1 | 7/2007 | Nasuno et al. | |
| 2007/0169810 A1 | 7/2007 | Van Duren et al. | |
| 2007/0283998 A1 | 12/2007 | Kuriyagawa et al. | |
| 2007/0289624 A1 | 12/2007 | Kuriyagawa et al. | |
| 2008/0032044 A1 | 2/2008 | Kuriyagawa et al. | |
| 2008/0041446 A1 | 2/2008 | Wu et al. | |
| 2008/0092945 A1 | 4/2008 | Munteanu et al. | |
| 2008/0092953 A1 | 4/2008 | Lee | |
| 2008/0105294 A1 | 5/2008 | Kushiya et al. | |
| 2008/0110495 A1 | 5/2008 | Onodera et al. | |

FOREIGN PATENT DOCUMENTS

| | | |
|---|---|---|
| DE | 3314197 A1 | 11/1983 |
| DE | 10104726 A1 | 8/2002 |
| DE | 102005062977 B3 | 9/2007 |
| FR | 2646560 | 11/1990 |
| GB | 2124826 A | 2/1984 |
| JP | 2000/173969 | 6/2000 |
| JP | 2000/219512 | 8/2000 |
| JP | 2002/167695 | 6/2002 |
| JP | 2002/270871 | 9/2002 |
| JP | 2002/299670 | 10/2002 |
| JP | 2004/332043 | 11/2004 |
| JP | 2005/311292 | 11/2005 |
| WO | WO 01/57932 A1 | 8/2001 |
| WO | WO 2005011002 | 2/2005 |
| WO | WO 2007/077171 A2 | 7/2007 |
| WO | WO 2008/025326 A2 | 3/2008 |

OTHER PUBLICATIONS

International Solar Electric Technology, Inc. (ISET) "Thin Film CIGS", http://www.isetinc.com/cigs.html, Oct. 1, 2008.

Kapur et al., "Fabrication of Light Weight Flexible CIGS Solar Cells for Space Power Applications", Mat. Res. Soc. Proc. vol. 668, (2001) pp. H3.5.1-H3.5.6, Materials Research Society, Warrendale, PA 15086.

Kapur et al., Non-Vacuum Printing Process for CIGS Solar Cells on Rigid and Flexible Substrates 29th IEEE Photovoltaic Specialists Conf., New Orleans, LA, IEEE, (2002) p. 688-691.

Kapur et al., "Non-Vacuum Processing of CIGS Solar Cells on Flexible Polymer Substrates", Proceedings of the Third World Conference on Photovoltaic Energy Conversion, Osaka, Japan, 2P-D3-43 (2003).

Kapur et al., "Non-Vacuum Processing of $CuIn_{1-x}Ga_xSe_2$ Solar Cells on Rigid and Flexible Substrates using Nanoparticle Inks", Thin Solid Films, vol. 431-432 (2003) pp. 53-57 Proceedings of Symposium B, European Materials Research Society, Strasbourg, France.

Kapur et al., "Fabrication of CIGS Solar Cells via Printing of Nanoparticle Precursor Inks", DOE Solar Program Review Meeting 2004, DOE/GO-102005-2067, p. 135-136.

(56) References Cited

OTHER PUBLICATIONS

Kapur et al., "Nanoparticle Oxides Precursor Inks for Thin Film Copper Indium Gallium Selenide (CIGS) Solar Cells", Mat. Res. Soc. Proc. vol. 668, (2001) pp. H2.6.1-H2.6.7, Materials Research Society, Warrendale, PA 15086.

Huang et al., Photoluminescence and Electroluminescence of ZnS:Cu Nanocrystals in Polymeric Networks, Applied Physics, Lett. 70 (18), May 5, 1997, pp. 2335-2337.

Huang et al., Preparation of $Zn_xCd_{1-x}S$ Nanocomposites in Polymer Matrices and their Photophysical Properties, Langmuir 1998, 14, pp. 4342-4344.

Yang et al., Fabrication and Characteristics of ZnS Nanocrystals/Polymer Composite Doped with Tetraphenylbenzidine Single Layer Structure Light-emitting Diode, Applied Physics Lett. vol. 69 (3), Jul. 15, 1996, pp. 377-379.

Yang et al., Preparation, Characterization and Electroluminescence of ZnS Nanocrystals in a Polymer Matrix, J. Mater. Chem., 1997, 7(1), pp. 131-133.

Yang et al., Electroluminescence from ZnS/CdS Nanocrystals/Polymer Composite, Synthetic Metals 91, (1997) 347-349.

International Search Report and Written Opinion of PCT Application No. PCT/US08/76908, date of mailing Dec. 1, 2008, 8 pages total.

Ellmer et al., Copper Indium Disulfide Solar Cell Absorbers Prepared in a One-Step Process by Reactive Magnetron Sputtering from Copper and Indium Targets; Elsevier Science B.V; Thin Solid Films 413 (2002) pp. 92-97.

International Search Report & Written Opinion of PCT Application No. PCT/US 09/46161, date of mailing Jul. 27, 2009, 14 pages total.

International Search Report & Written Opinion of PCT Application No. PCT/US 09/46802, mailed on Jul. 31, 2009, 11 pages total.

Onuma et al., Preparation and Characterization of CuInS Thin Films Solar Cells with Large Grain, Elsevier Science B.V; Solar Energy Materials & Solar Cells 69 (2001) pp. 261-269.

Examination Report for PCT patent application PCT/US2008/076908 (Apr. 8, 2010).

International Search Report and Written Opinion for PCT Application No. PCT/US2008/078001 mailed on Dec. 2, 2008, 7 pages.

Non-Final Office Action of Sep. 3, 2010 for U.S. Appl. No. 12/210,173, 11 pages.

\* cited by examiner

METHOD AND MATERIAL FOR PURIFYING IRON DISILICIDE FOR PHOTOVOLTAIC APPLICATION

CROSS-REFERENCES TO RELATED APPLICATIONS

This application claims priority to U.S. Provisional Patent Application No. 60/976,239, filed Sep. 28, 2007, entitled "METHOD AND MATERIAL FOR PURIFYING IRON DISILICIDE FOR PHOTOVOLTAIC APPLICATION" by inventor FREDERIC VICTOR MIKULEC et al. commonly assigned and incorporated by reference herein for all purposes.

STATEMENT AS TO RIGHTS TO INVENTIONS MADE UNDER FEDERALLY SPONSORED RESEARCH AND DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

The present invention relates generally to photovoltaic materials. More particularly, the present invention provides a method and structure for processing semiconductor materials used for the manufacture of photovoltaic devices. Merely by way of example, the present method and structure have been implemented using a commercial source of iron disilicide, but it would be recognized that the invention may have other configurations.

From the beginning of time, mankind has been challenged to find ways of harnessing energy. Energy comes in the forms such as petrochemical, hydroelectric, nuclear, wind, biomass, solar, and more primitive forms such as wood and coal. Over the past century, modern civilization has relied upon petrochemical energy as an important energy source. Petrochemical energy includes gas and oil. Gas includes lighter forms such as butane and propane, commonly used to heat homes and serve as fuel for cooking. Gas also includes gasoline, diesel, and jet fuel, commonly used for transportation purposes. Heavier forms of petrochemicals can also be used to heat homes in some places. Unfortunately, the supply of petrochemical fuel is limited and essentially fixed based upon the amount available on Earth. Additionally, as more people use petrochemicals in growing amounts, it is rapidly becoming a scarce resource, which will eventually be depleted over time.

More recently, environmentally clean and renewable sources of energy have been desired. An example of a clean source of energy is hydroelectric power. Hydroelectric power is derived from electric generators driven by the flow of water produced by dams such as the Hoover Dam in Nevada. The electric power generated is used to power a large portion of the city of Los Angeles in California. Clean and renewable sources of energy also include wind, waves, biomass, and the like. That is, windmills convert wind energy into more useful forms of energy such as electricity. Still other types of clean energy include solar energy. Specific details of solar energy can be found throughout the present background and more particularly below.

Solar energy technology generally converts electromagnetic radiation from the sun to other useful forms of energy. These other forms of energy include thermal energy and electrical power. For electrical power applications, solar cells are often used. Although solar energy is environmentally clean and has been successful to a point, many limitations remain to be resolved before it becomes widely used throughout the world. As an example, one type of solar cell uses crystalline materials, which are derived from semiconductor material ingots. These crystalline materials can be used to fabricate optoelectronic devices that include photovoltaic and photodiode devices that convert electromagnetic radiation into electrical power. However, crystalline materials are often costly and difficult to make on a large scale. Additionally, devices made from such crystalline materials often have low energy conversion efficiencies. Other types of solar cells use "thin film" technology to form a thin film of photosensitive material to be used to convert electromagnetic radiation into electrical power. Similar limitations exist with the use of thin film technology in making solar cells. That is, efficiencies are often poor. Additionally, film reliability is often poor and cannot be used for extensive periods of time in conventional environmental applications. Often, thin films are difficult to mechanically integrate with each other. These and other limitations of these conventional technologies can be found throughout the present specification and more particularly below.

From the above, it is seen that improved techniques for manufacturing photovoltaic materials and resulting devices are desired.

BRIEF SUMMARY OF THE INVENTION

According to embodiments of the present invention, a method and a system for forming semiconductor materials for photovoltaic applications is provided. More particularly, the present invention provides a method and structure for processing semiconductor materials used for the manufacture of photovoltaic devices. Merely by way of example, the method has been used to provide beta iron disilicide for photovoltaic application. But it would be recognized that the present invention has a much broader range of applicability.

In a specific embodiment, the method includes providing a first sample of iron disilicide. The first sample of iron disilicide comprises at least alpha iron disilicide, beta phase iron disilicide, and epsilon phase iron silicide and characterized by a first particle size. The method includes maintaining the first sample of iron disilicide in an inert environment and subjecting the first sample of iron disilicide to an heating process while maintaining the first sample of iron disilicide in the inert environment to form a second sample of iron disilicide. The second sample of iron disilicide comprises substantially beta phase iron disilicide (greater than about 90 percent). The second iron disilicide is characterized by a second particle size. The method forms a first mixture of material comprising the second sample of iron disilicide and an organic solvent. In a specific embodiment, the first mixture of material including the second sample of iron disilicide is subjected to a grinding process. The method includes removing the organic solvent; and forms a third sample of iron disilicide comprising substantially beta iron disilicide. The third sample of iron disilicide is characterized by a third particle size.

In a specific embodiment, the method includes providing a first sample of an iron disilicide. The first sample of iron disilicide comprises at least an alpha phase entity ranging from about 5% to about 20% of a total phase entity, a beta phase entity comprising about 30% to about 75% of the phase entity, and an epsilon phase entity comprising about 5% to about 20% of the total phase entity. The method includes maintaining the first sample of iron disilicide in an inert environment, for example, nitrogen, helium, argon, or others. The method subjects the first sample of iron disilicide to a thermal process while maintaining the first sample of iron disilicide in the inert environment to cause formation of a second sample of iron disilicide. The second sample of iron disilicide comprises substantially beta phase iron disilicide and characterized by a first particle size ranging from about 1 to about 20 microns. The method includes introducing an organic solvent to the second sample to form a first mixture of material comprising the second sample of iron disilicide and the organic solvent. In a specific embodiment, the method processes the first mixture of material including the second sample of iron disilicide using a grinding process to convert the second sample of iron disilicide having the first particle size to a third sample of iron disilicide having a second particle size. In a specific embodiment, the second particle size ranges from about 1 micron to about 2 microns. The method then removes the organic solvent from the third sample of iron disilicide and outputting the third sample of iron disilicide characterized by the second particle size and greater than about 90% of the beta phase entity.

Many benefits are achieved by ways of present invention. For example, the present invention uses a commercial source of iron disilicide as a starting material to form substantially pure beta phase iron disilicide. The substantially pure beta phase iron disilicide can be further processed to form iron disilicide of desired characteristics, such as particle size, bandgap, resistivity, carrier mobility, carrier density, and others. Additionally, the present method uses environmentally friendly materials that are non-toxic. Depending on the embodiment, one or more of the benefits can be achieved. These and other benefits will be described in more detailed throughout the present specification and particularly below.

DETAILED DESCRIPTION OF THE INVENTION

According to embodiments of the present invention, a method and a system for forming semiconductor materials for photovoltaic applications is provided. More particularly, the present invention provides a method and structure for processing semiconductor materials used for the manufacture of photovoltaic devices. Merely by way of example, the method has been used to provide beta iron disilicide for photovoltaic application. But it would be recognized that the present invention has a much broader range of applicability.

Figure 1:
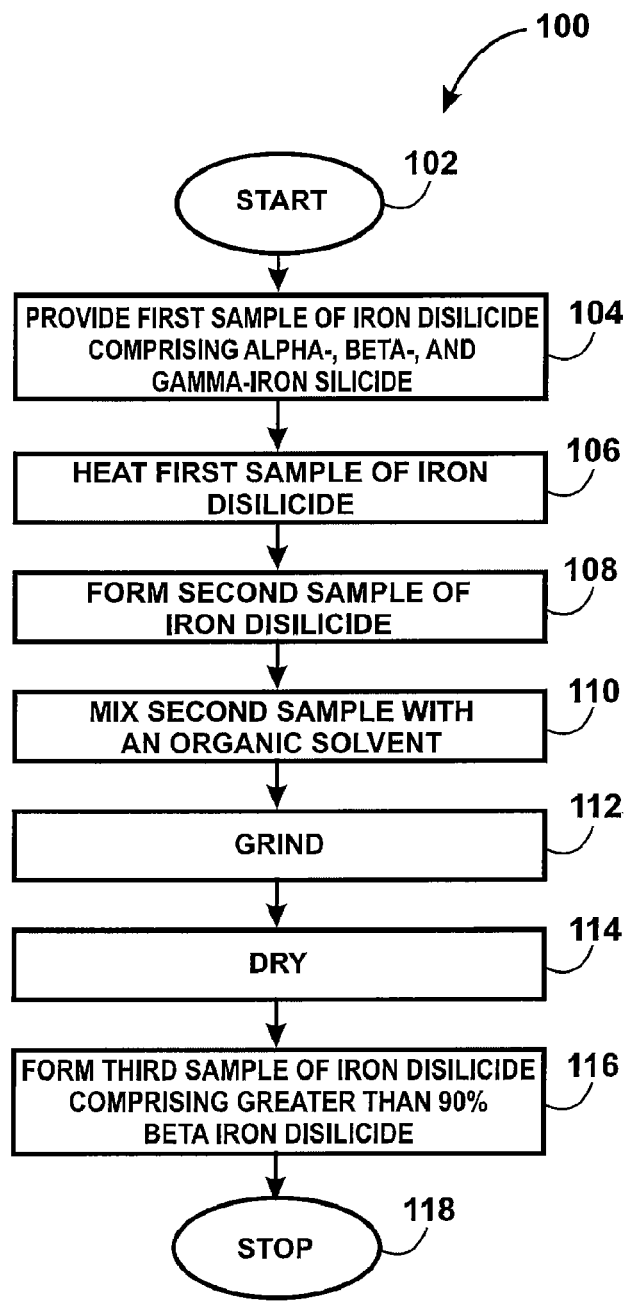
FIG. 1 is a simplified flow diagram illustrating a method of forming beta phase iron disilicide according to an embodiment of the present invention.

FIG. 1 is a simplified flow diagram 100 illustrating a method for forming a sample of beta phase iron disilicide according to an embodiment of the present invention. The method may be summarized as follow:
1. Step 102, start;
2. Step 104, provide a first sample of iron disilicide, comprises an alpha phase entity, a beta phase entity and an epsilon phase entity;
3. Step 106, subject at least the sample of iron disilicide to a thermal process;
4. Step 108, convert the first sample of iron disilicide to a second sample of iron disilicide comprising substantially the beta phase entity (for example, greater than about 90 percent) characterized by a first particle size (about 20 mesh);
5. Step 110, mix the second sample of iron disilicide with a solvent;
6. Step 112, grind;
7. Step 114, dry;
8. Step 116, form a third sample of iron disilicide comprising substantially beta phase iron disilicide characterized by a second particle size (about 1 micron to 2 microns);
9. Step 118, Stop.

The above sequence of steps provides a method of forming a sample of iron disilicide comprising substantially beta phase iron disilicide according to an embodiment of the present invention. As shown the method uses a combination of steps, including a thermal process to convert the alpha phase and the epsilon phase iron disilicide into beta phase iron disilicide. Further, the method uses a grinding process to form the sample of iron disilicide comprising substantially beta phase iron disilicide of desired particle size. Merely by way of example, the present method has been used in fabricating photovoltaic devices. But it should be recognized that the present invention has a much broader range of applicability.

Figure 2:
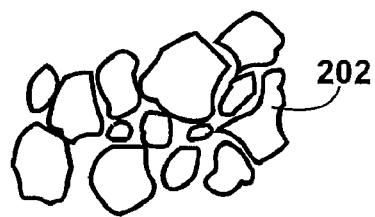
FIG. 2-6 are simplified diagrams illustrating a method of forming beta phase iron disilicide according to an embodiment of the present invention.

FIG. 2 is a simplified diagram of a first sample of iron disilicide 202 according to an embodiment of the present invention. The first sample of iron disilicide is commercially available, for example from sources such as Alfa-AESAR of Massachusetts, USA. The first sample of iron disilicide comprises at least alpha phase iron disilicide, beta phase iron disilicide, and epsilon phase iron silicide. The first sample of iron disilicide comprises about 5% to about 20% of the alpha phase entity, about 30% to about 75% of the beta phase entity, and about 5% to about 20% of the epsilon phase entity. Of course there can be other variations, modifications, and alternatives.

Figure 3:
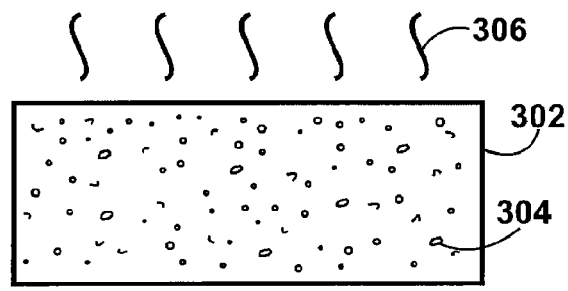

Referring to FIG. 3, a simplified diagram illustrating a method of forming a sample of beta phase iron disilicide is shown. The diagram is merely an example and should not unduly limit the claims herein. One skilled in the art would recognize other variations, modifications, and alternatives. As shown, a first sample of iron disilicide 304 is provided in a chamber 302. In a specific embodiment, the first sample of iron disilicide is maintained in an inert gas environment within the chamber. The inert environment can be provided using, for example, nitrogen, argon, helium, and the like. As shown, the first sample of iron disilicide is subjected to a thermal process 306 while maintaining in the inert environment to form a second sample of iron disilicide. In a specific embodiment, the thermal process is provided at a temperature ranging from about 700 Degree Celsius to about 800 Degree Celsius for a time period of about 16 hours to about 17 hours. In an alternative embodiment, the thermal process can be provided at a temperature ranging from about 800 Degree Celsius to about 850 Degree Celsius for a time period of about 16 hours to about 18 hours. The thermal process converts the alpha phase iron disilicide and the epsilon phase iron silicide to the beta phase entity. The second sample of iron disilicide comprises substantially beta iron disilicide. In a specific embodiment, the second sample of iron disilicide comprises greater than about 90 percent of beta iron disilicide. In a specific embodiment, the second sample of iron disilicide is characterized by a particle size ranging from about 1 micron to about 20 microns. Of course there can be other variations, modifications, and alternatives.

Figure 4:
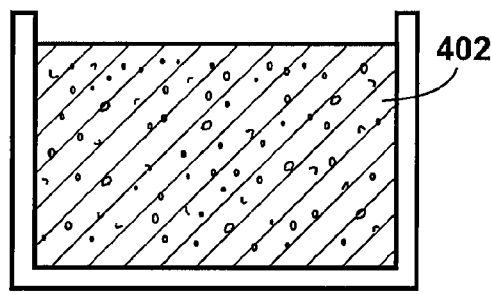
Figure 5:
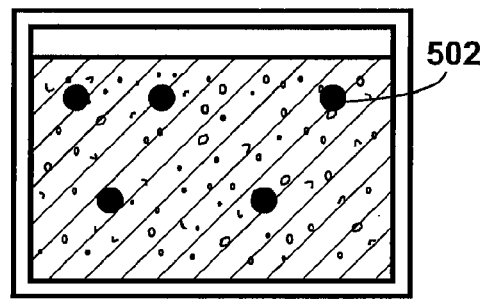

The method includes allowing the second sample of iron disilicide to cool to about room temperature. In a specific embodiment, the cooled second sample of iron disilicide is mixed with a suitable organic solvent to form a first mixture of material 402 as shown in FIG. 4. Such organic solvent may include alkanes (such as octane), or alcohols (such as isopropyl alcohol) among others. In a specific embodiment, the first mixture of material including the second sample of iron disilicide, which comprises greater than 90 percent beta phase iron disilicide, is subjected to a grinding process as shown in FIG. 5. The grinding process uses, for example, a ball milling technique in a preferred embodiment. Other grinding processes may also be used. In a specific embodiment, the ball milling technique uses using a plurality of spheres 502. The plurality of spheres may be metal balls or ceramic balls depending on the application. In a specific embodiment, the plurality of spheres are ceramic balls made of zirconium dioxide. Each of the plurality of spheres has a diameter of about 3 mm in a specific embodiment. The first mixture of material, including the second sample of iron disilicide and the plurality of ceramic balls are provided in a suitable vessel. Example of such vessel may include zirconium dioxide coated stainless steel jar from Restsch, Haan, Germany. In a specific embodiment, the vessel containing the first mixture of material and a plurality of zirconium dioxide balls is loaded into a rotating planetary ball mill, provided also by Restsch, Haan, Germany. Depending on the embodiment, milling time ranges from about 15 hours to about 30 hours. Additionally, depending upon the solvent and other conditions, the jar may develop an internal pressure that may be reduced by stopping the ball mill, resting the system for about 1 hour, then continuing the milling process. Of course there can be other modifications, variations, and alternatives. This embodiment uses a stainless steel jar coated with zirconium dioxide (Retsch) as the mixing vessel. The jar is filled with about 50 grams of 3 mm diameter zirconium dioxide balls, 20 grams of the second sample of iron disilicide, and 15 grams of a suitable solvent such as octane. The jar is then loaded into a rotating planetary ball mill (Retsch) and milled for about 15 to 30 hours at a speed of 400 to 600 rpm. Depending upon the solvent and other conditions, the jar may develop an internal pressure that may be reduced by stopping the ball mill, resting the system for about 1 hour, then continuing the milling process.

Figure 6:
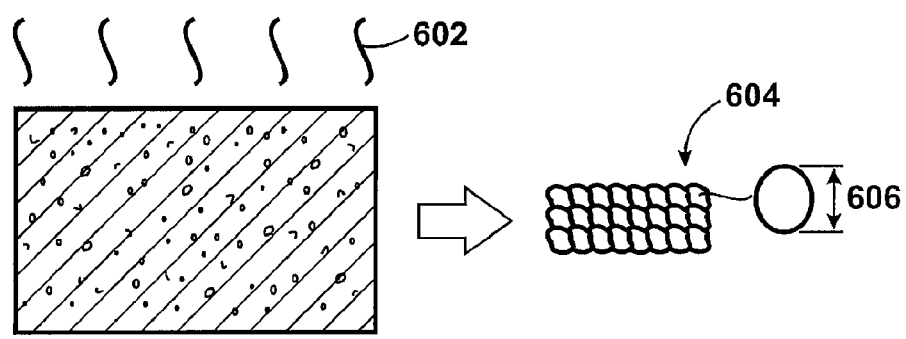

As shown in FIG. 6, the method removes the organic solvent in the first mixture of material using a drying process 602 and forms a third sample of iron disilicide 604. The drying process can include a vacuum process or a heating process, or a combination to evaporate the organic solvent from the first mixture of material. In a specific embodiment, the third sample of iron disilicide comprises at least 95 percent of beta iron phase disilicide. A substantially uniform particle size 606 of about 1 micron to about 2 micron characterizes the third sample of iron disilicide. In a specific embodiment, the third sample of iron disilicide has a desired semiconductor characteristic with a bandgap ranging from 0.8 eV to 0.9 eV. Of course there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for processing iron disilicide for manufacture of photovoltaic devices, the method comprising:
   providing a first sample of an iron disilicide comprising at least an alpha phase entity ranging from about 5% to about 20% of a total phase entity, a beta phase entity comprising about 30% to about 75% of the phase entity, and an epsilon phase entity comprising about 5% to about 20% of the total phase entity;
   maintaining the first sample of iron disilicide in an inert environment;
   subjecting the first sample of iron disilicide to a thermal process while maintaining the first sample of iron disilicide in the inert environment to cause formation of a second sample of iron disilicide comprising substantially beta phase iron disilicide, the second iron disilicide being characterized by a first particle size ranging from about 1 micron to about 20 microns;
   introducing an organic solvent to the second sample to form a first mixture of material comprising the second sample of iron disilicide and the organic solvent;
   processing the first mixture of material including the second sample of iron disilicide using a grinding process to convert the second sample of iron disilicide having the first particle size to a third sample of iron disilicide having a second particle size ranging from about 1 micron to about 2 microns;
   removing the organic solvent from the third sample of iron disilicide in the organic solvent; and
   outputting the third sample of iron disilicide characterized by the second particle size and greater than about 90% of the beta phase entity.

2. The method of claim 1 wherein the first iron disilicide is from a commercial source.

3. The method of claim 1 wherein the first particle size ranges from about 15 mesh to about 25 mesh.

4. The method of claim 1 wherein the inert environment is provided by nitrogen, argon, helium, and others.

5. The method of claim 1 wherein the thermal process is provided at a temperature ranging from about 800 Degree Celsius to about 850 Degree Celsius for about 16 hours to about 17 hours.

6. The method of claim 1 wherein the thermal process is provided at a temperature ranging from about 700 Degree Celsius to about 800 Degree Celsius for about 16 hours to about 18 hours.

7. The method of claim 1 wherein the organic solvent is selected from: isopropyl alcohol (IPA), octane, and others.

8. The method of claim 1 wherein the second sample of iron disilicide comprises greater than about 95 percent beta phase iron disilicide.

9. The method of claim 1 wherein the first particle size is about 20 mesh.

10. The method of claim 1 wherein the grinding process is a ball milling process.

11. The method of claim 10 wherein the ball milling process comprises:
    providing a plurality of ceramic balls having a diameter ranging from about 2.5 mm to about 3.5 mm;
    providing the mixture of material and the plurality of ceramic balls in a milling vessel; and
    milling the mixture of material using a rotating planetary ball mill.

12. The method of claim 1 wherein the third sample of iron disilicide comprises at least 90 percent of beta phase iron disilicide.

13. The method of claim 1 wherein the second particle size is about 2 micron and less.

14. The method of claim 1 wherein the second particle size ranges from about 1 micron to about 2 micron.

15. The method of claim 1 wherein the third sample of iron disilicide is characterized by a bandgap ranging from about 0.8 eV to about 0.9 Ev.

\* \* \* \* \*